United States Patent [19]
Aoki

[11] Patent Number: 5,013,937
[45] Date of Patent: May 7, 1991

[54] COMPLEMENTARY OUTPUT CIRCUIT FOR LOGIC CIRCUIT

[75] Inventor: Yasushi Aoki, Tokyo, Japan

[73] Assignee: NEC Corporation, Tokyo, Japan

[21] Appl. No.: 351,346

[22] Filed: May 15, 1989

[30] Foreign Application Priority Data

May 13, 1988 [JP] Japan .................................. 63-116583

[51] Int. Cl.[5] .................. H03K 19/017; H03K 19/02; H03K 19/21
[52] U.S. Cl. .................................... 307/448; 307/451; 307/471; 307/473; 307/263; 307/264; 307/475
[58] Field of Search ............... 307/443, 448, 451, 471, 307/473, 263–264, 270, 475

[56] References Cited
U.S. PATENT DOCUMENTS

T952,012 11/1976 Lee ...................................... 307/451

Primary Examiner—Stanley D. Miller
Assistant Examiner—Margaret Rose Wambach
Attorney, Agent, or Firm—Sughrue, Mion, Zinn, Macpeak & Seas

[57] ABSTRACT

An output circuit for a high speed and low power logic circuit is disclosed. The logic circuit performs a logic operation on a plurality of input data signals supplied thereto and produces true and complementary intermediate output signals, the logic high level of the intermediate output signal being lower than a first power voltage and the logic low level thereof being substantially equal to a second power voltage. The output circuit includes a P-channel MOS transistor having a gate supplied with the complementary intermediate output signal, a source connected to a power voltage supplied with the first power voltage and a drain connected to an output terminal, and an N-channel MOS transistor having a gate connected to the power terminal, a source supplied with the true intermediate output signal and a drain connected to the output terminal, and thus produces at the output terminal an output signal having a logic amplitude between the first and second power voltages.

11 Claims, 5 Drawing Sheets

COMPLEMENTARY OUTPUT CIRCUIT FOR LOGIC CIRCUIT

BACKGROUND OF THE INVENTION

The present invention relates to a MOS transistor logic circuit and, more particularly, to an output circuit for a high speed and low power logic circuit.

There are two types of logic circuits. One of them is a complementary MOS transistor logic circuit and the other is a single channel MOS transistor logic circuit, and in particular an N-channel device. The complementary MOS transistor logic circuit uses P- and N-channel MOS FET's and has an advantage of a low power consumption, but has a disadvantage of a relatively low speed operation. This is because of P-channel MOS transistor has a switching speed which is slower than that of an N-channel MOS transistor. In particular, a logic circuit including a plurality of P-channel MOS transistors connected in series between a power supply terminal and an output terminal requires a considerably long switching time. In contrast, the N-channel MOS transistor logic circuit uses enhancement and depletion type MOS FET's and has an advantage of high speed operation. However, the logic circuit employing enhancement and depletion N-channel MOS transistors has a disadvantage since it requires large power consumption.

As a high speed and low power logic circuit, therefore, a logic circuit is used that employs only enhancement N-channel MOS transistors driven in a push-pull manner with power supplied between higher and lower power supply voltages. However, such a logic circuit has a disadvantage since the logic high level of an output signal produced therefrom does not reach the higher power supply voltage, although the logic low level of the output signal reaches the lower power supply voltage. This is because a MOS transistor exists whose source is connected to an output terminal and whose drain is connected to a power supply terminal supplied with the higher power supply voltage. The logic high level of the output signal therefore becomes lower than the higher power supply voltage by a threshold voltage of the used transistor. A so-called bootstrap circuit is often employed to raise the logic high level of the output signal up to the higher power supply voltage. However, the bootstrap circuit lowers the operation speed of the logic circuit. Therefore, a level conversion circuit is added as an output circuit, in place of using the bootstrap circuit, to convert the logic high level of the output signal into a voltage level equal to the higher power supply voltage.

A complementary MOS (C-MOS) inverter is well known in the art as a level conversion circuit. The C-MOS inverter consists of P-channel and N-channel MOS transistors connected in series between the higher and lower power terminals, and the output signal produced from the logic circuit is applied to the gates of these transistors. The high level of the output signal turns the N-channel transistor ON and the low level thereof turns the P-channel transistor ON. As a result, the output signal from the logic circuit is widened to have an amplitude between the first and second power supply voltages.

It should be noted that the logic high level of the output signal is still slightly lower than the first power supply voltage. For this reason, the conductive resistance of the N-channel transistor is relatively large and thus reduces the load driving capability thereof. The operation speed for changing the output signal from the higher power supply voltage to the lower power supply voltage is thereby reduced. Moreover, the C-MOS inverter operates as an additional gate circuit, so that the above changing speed is further reduced.

SUMMARY OF THE INVENTION

Therefore, an object of the present invention is to provide an improved output circuit for a logic circuit in order to improve the high speed operation and to lower the power consumption of the logic circuit.

Another object of the present invention is to provide an output circuit which receives a signal having a first amplitude and outputs a signal having a second enlarged amplitude without lowering the operation speed.

Still another object of the present invention is to provide a logic gate which operates at high speed with low power consumption and produces an output signal whose logic high level is substantially equal to a higher level of a power supply and whose logic low level is substantially equal to a lower level of the power supply.

According to the present invention, a circuit driven by a power level between higher and lower power voltages comprises a first input terminal supplied with an input signal having a logic high level which is lower than the higher power voltage and a logic low level substantially equal to the lower power voltage, a second input terminal supplied with a logically processed signal of the input signal, an output terminal, a potential terminal supplied with the higher power voltage, a P-channel MOS transistor having a gate connected to the second input terminal and a source-drain path connected between the potential terminal and the output terminal, and an N-channel MOS transistor having a gate connected to the potential terminal and a source-drain path connected between the first input terminal and the output terminal.

When the input signal takes the logic high level, the N-channel transistor is biased by a voltage slightly smaller than a threshold voltage thereof and is thus turned OFF. On the other hand, the P-channel transistor is supplied at the gate thereof with the second power voltage and is thus turned ON. Accordingly, the output terminal is raised up to the higher power voltage. When the input signal takes the logic low level, the N-channel transistor is biased by the higher power voltage and is thus turned ON. Since the N-channel transistor is biased by the power voltage, the conductive resistance thereof is extremely small and thus drives the output terminal with a large current. Moreover, since the input signal is applied to the source of the N-channel transistor, not to the gate thereof, the output terminal is changed to the lower power voltage at a high speed. On the other hand, the P-channel transistor is supplied at the gate thereof with the logic high level of the input signal. Since the logic high level of the input signal is lower than the higher power voltage, the P-channel transistor is not in the turned-OFF state, but in a high internal impedance state. For this reason, the output terminal is not lowered to the lower power voltage, and is at a voltage slightly higher than the lower power voltage. However, since the N-channel transistor has a large current capacity, the voltage slightly higher than the lower power voltage is of negligible value. The output terminal thus substantially takes the lower power voltage.

BRIEF DESCRIPTION OF THE DRAWINGS

The above and other objects, advantage and features of the present invention will be more apparent from the following description taken in conjunction with the accompanying drawings, in which.

DETAILED DESCRIPTION OF THE EMBODIMENTS

Figure 1:
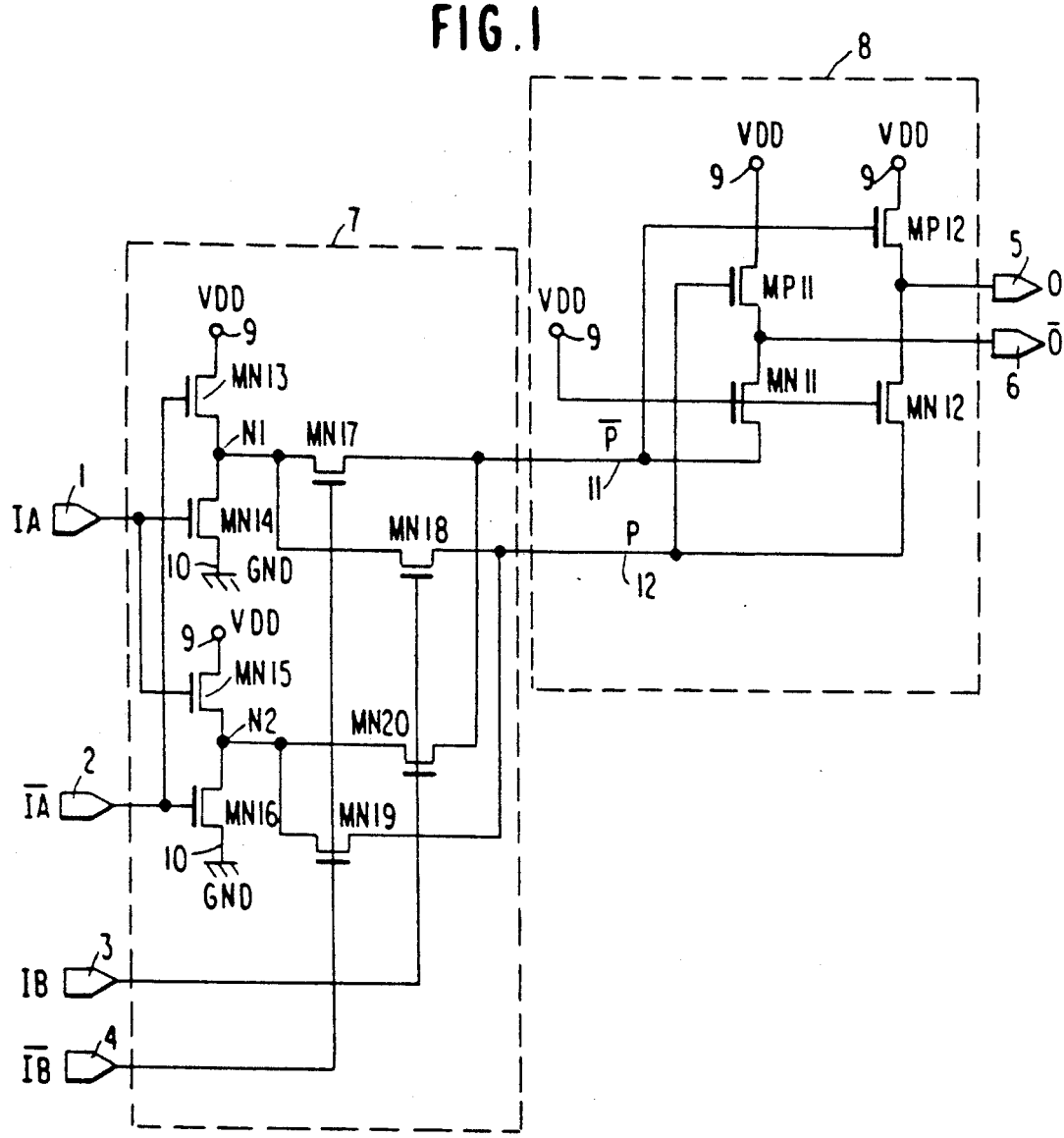
FIG. 1 is a circuit diagram representative of a first embodiment of the present invention.

Referring to FIG. 1, there is shown a 2-input EX-OR (Exclusive OR) gate circuit as a first embodiment of the present invention. This gate circuit includes first true and complementary input data terminals 1 and 2, respectively, second true and complementary input data terminals 3 and 4, respectively, true and complementary output terminals 5 and 6, respectively, a logic operation circuit 7, and an output circuit 8. The terminal 1 is supplied with a first data signal IA whose logic high level is substantially equal to a first power voltage and whose logic low level is substantially equal to a second power voltage. In the present and following description, the first power voltage is a positive voltage of 5 V and indicated as "$V_{DD}$", and the second power voltage is a ground level, i.e. 0 V, and indicated as "GND". The terminal 2 is supplied with an inverted signal $\overline{IA}$ of the first data signal IA. The terminal 3 is supplied with a second data signal IB whose logic high level is substantially $V_{DD}$ and whose logic low level is substantially GND, and the terminal 4 is supplied with an inverted signal $\overline{IB}$ of the second data signal IB.

The logic operation circuit 7 is constituted of eight MOS transistors MN13 to MN20, all of which are of an enhancement N-channel type. The transistor MN13 and MN14 are connected in series between a first power supply terminal 9 applied with $V_{DD}$ and a second power supply terminal 10 applied with GND. The transistors MN15 and MN16 are also connected in series between the terminals 9 and 10. The transistor MN17 is connected between a node N1 of the transistors MN13 and MN14 and an intermediate complementary output terminal 11 and the transistor MN18 is connected between the node N1 and an intermediate true output terminal 12. The transistor MN19 is connected between a node N2 of the transistors MN15 and MN16 and the true output terminal 12, and the transistor MN20 is connected between the node N2 and the complementary output terminal 11. The input terminal 1 is connected in common to the gates of the transistors MN14 and MN15 and the terminal 2 is connected in common to the gates of the transistors MN13 and MN16. The terminal 3 is connected in common to the gags of the transistors MN18 and MN20 and the terminal 4 is connected in common to the gates of the transistors MN17 and MN19.

When the first and second input data signals IA and IB both take the logic high level, the transistors MN14, MN18, MN15 and MN20 are turned ON and the remaining transistors MN13, MN17, MN16 and MN19 are turned OFF. In case where both of the data signals IA and IB take the logic low level, the transistors MN14, MN18, MN15 and MN20 are turned OFF, and the transistors MN13, MN17, MN16 and MN19 are turned ON. Accordingly, so long as both of the data signals IA and IB take the same logic level, an intermediate true output signal P at terminal 12 takes the logic low level and an intermediate complementary output signal $\overline{P}$ at terminal 11 takes the logic high level. On the other hand, when the first and second data signals IA and IB take different logic levels from each other, the transistors MN14, MN17, MN15 and MN19 (or MN13, MN18, MN16 and MN20) are turned ON, and the transistors MN13, MN18, MN16 and MN20 (or MN14, MN17, MN15 and MN19) are turned OFF. Accordingly, the intermediate true and complementary output signals P and $\overline{P}$ take the logic high level and logic low level, respectively. Thus, the logic operation circuit 7 performs an EX-OR logic operation on two input data signals IA and IB. Since the circuit 7 is composed only of the enhancement N-channel MOS transistors, it performs the logic operation at high speed. Moreover, the transistors MN13 and MN14 and those MN15 and MN16 are driven in a push-pull manner, respectively, and hence the power consumption of the circuit 7 is very small.

However, since the logic operation circuit 7 includes only the enhancement N-channel MOS transistors, the logic high level of the intermediate output signal P (or $\overline{P}$) does not reach the $V_{DD}$ level. It is lower than the $V_{DD}$ level by the threshold voltage ($V_{TN}$) of the N-channel MOS transistors. Thus, the logic high level of the intermediate output signal P ($\overline{P}$) is at a level of ($V_{DD} - V_{TN}$) and the logic low level thereof is at GND level. In other words, the intermediate output signal P ($\overline{P}$) has a logic amplitude between the ($V_{DD} - V_{TN}$) level and GND level.

In order to produce an output signal having a substantial logic amplitude between $V_{DD}$ and GND levels without lowering a total logic operation speed, the output circuit 8 is provided between the intermediate output terminals 11 and 12 with the output terminals 5 and 6 as the final output terminals of the EX-OR gate circuit. The output circuit 8 includes an enhancement P-channel MOS transistor MP11 having a source connected to the $V_{DD}$ terminal 9, a drain connected to the complementary output terminal 6 and a gate connected to the intermediate true terminal 12, an enhancement N-channel MOS transistor MN11 having a drain connected to the terminal 6, a source connected to the intermediate complementary terminal 11 and a gate connected to the $V_{DD}$ terminal 9, an enhancement P-channel MOS transistor MP12 having a source connected to the $V_{DD}$ terminal 9, a drain connected to the true output terminal 5 and a gate connected to the intermediate complementary terminal 11, and an enhancement N-channel MOS transistor MN12 having a drain connected to the output terminal 5, a source connected to the intermediate true terminal 12 and a gate connected to the $V_{DD}$ terminal 9.

When the intermediate output signal P is at the logic low level (i.e., GND level), the transistor MN12 is supplied with $V_{DD}$ voltage between the gate and source thereof, so that the conductive resistance thereof is extremely small and thus drives the output terminal 5 with a large current. The potential at the terminal 5 is thereby changed to the GND level at high speed. At this time, the transistor MP12 is applied at the gate thereof with the ($V_{DD} - V_{TN}$) level, so that it is not in the cut-off state, but in the high internal impedance state. Since the transistor MN12 has a large current ability, the potential at the terminal 5 is slightly higher than the GND level and takes a level of about 0.2 V. This voltage is negligible. Thus, a true output signal O is produced at the terminal 5 with the logic low level substantially at GND level. The logic low level of the intermediate signal P is supplied to the transistor MP11 to turn the same ON. On the other hand, the transistor MN11 is supplied at the source with the ($V_{DD}-V_{TN}$) level. The gate of the transistor MN11 is supplied with the $V_{DD}$ level, and hence the voltage between the gate and source thereof is equal to $V_{TN}$. Since a so-called back gate bias effect occurs in the transistor MN11, the transistor MN11 is biased by a voltage slightly smaller than the threshold voltage thereof. The transistor MN11 is thereby in the cut-off state, so that the potential at the terminal 6 is changed up to the $V_{DD}$ level. Thus, a complementary output signal $\overline{O}$ is produced at the terminal 6 with the logic high level of the $V_{DD}$ level. When the intermediate signals P and $\overline{P}$ are changed to the logic high and low level, respectively, the true and complementary signals O and $\overline{O}$ are changed to the $V_{DD}$ level and to substantially GND level, respectively.

Thus, the EX-OR gate circuit shown in FIG. 1 performs an exclusive OR logic operation on two data signals IA and IB at high speed and with low power and produces true and complementary output signals O and $\overline{O}$ each having a logic amplitude between the $V_{DD}$ level and substantially GND level.

In the gate circuit shown in FIG. 1, when the intermediate signal P is at the logic low level, the transistor MP12 is not in the cut-off state, as described hereinbefore. For this reason, a slight current flows from the $V_{DD}$ terminal 9 to the GND terminal 10 through the transistors MP12, MN12, MN18 (or MN19) and MN14 (or MN16). In the case where the signal $\overline{P}$ is at the low level, the slight current flows through the transistors MP11 and MN11 to the GND terminal 10,. For this reason, the power consumption of the gate circuit of FIG. 1 is slightly larger than that of a C-MOS logic circuit.

Figure 2:
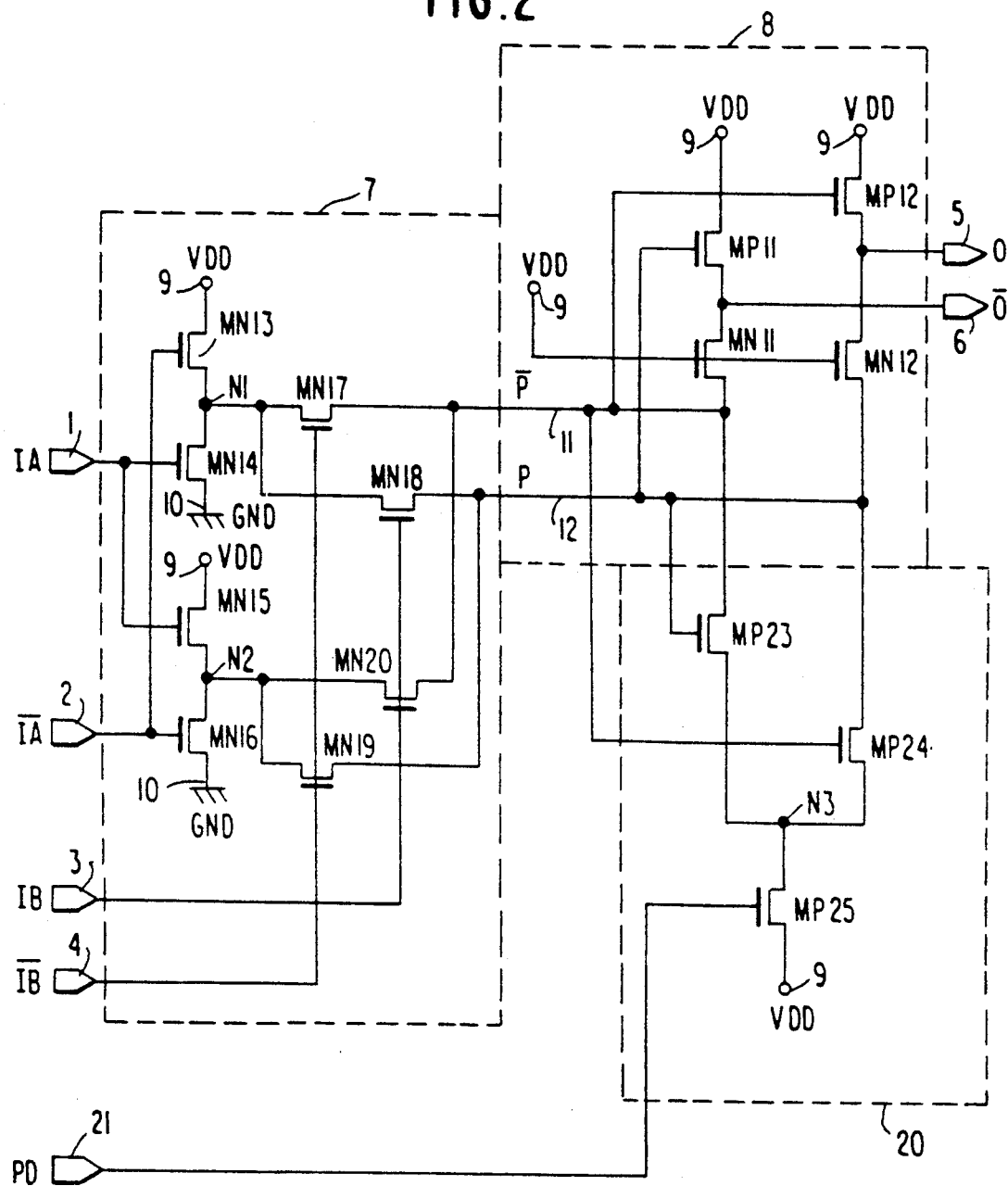
FIG. 2 is a circuit diagram representative of a second embodiment of the present invention.

In order to further reduce the power consumption, a gate circuit shown as a second embodiment of the present invention in FIG. 2 includes a power reduction circuit 20. This gate circuit is also a 2-input EX-OR gate circuit, and hence the same constituents as those shown in FIG. 1 are denoted by the same reference numerals and symbols to omit the further description thereof. The power reduction circuit 20 includes an enhancement P-channel MOS transistor MP23 connected between the terminal 11 and a node N3 and having a gate connected to the terminal 12, an enhancement P-channel MOS transistor MP24 connected between the terminal 12 and the node N3 had having a gate connecged to the terminal 11, and an enhancement P-channel MOS transistor MP25 connected between the node N3 and the $V_{DD}$ terminal 9 and having a gate connected to a control terminal 21 which is in turn supplied with a power reduction control signal PD. When this control signal PD takes the $V_{DD}$ level, the transistor MP25 is turned OFF to disconnect the node N3 from the $V_{DD}$ terminal 9. Accordingly, the logic circuit in this case performs the same operation as that of FIG. 1. When the control signal PD takes the GND level, the transistor MP25 is turned ON to supply the $V_{DD}$ level to the node N3. Assuming that the signal P is at the logic low level at this time, the transistor MP23 is turned ON. The logic high level of the signal P is thereby changed from the ($V_{DD}-V_{TN}$) level to the $V_{DD}$ level. As a result, the transistor MP12 is changed from the high impedance state to the cut-off state. A current no longer flows through the transistor MP12. Similarly, in case of the signal $\overline{P}$ being at the logic low level, the transistor MP24 is turned ON to change the transistor MP11 to the cut-off state. No power is thereby consumed. By supplying the control signal PD at the GND level to the terminal 21 during the stand-by period of the logic gate and/or during the steady period of the logic levels of the input data signals IA and IB, the power consumption of gate circuit shown in FIG. 2 is relatively reduced.

Figure 3:
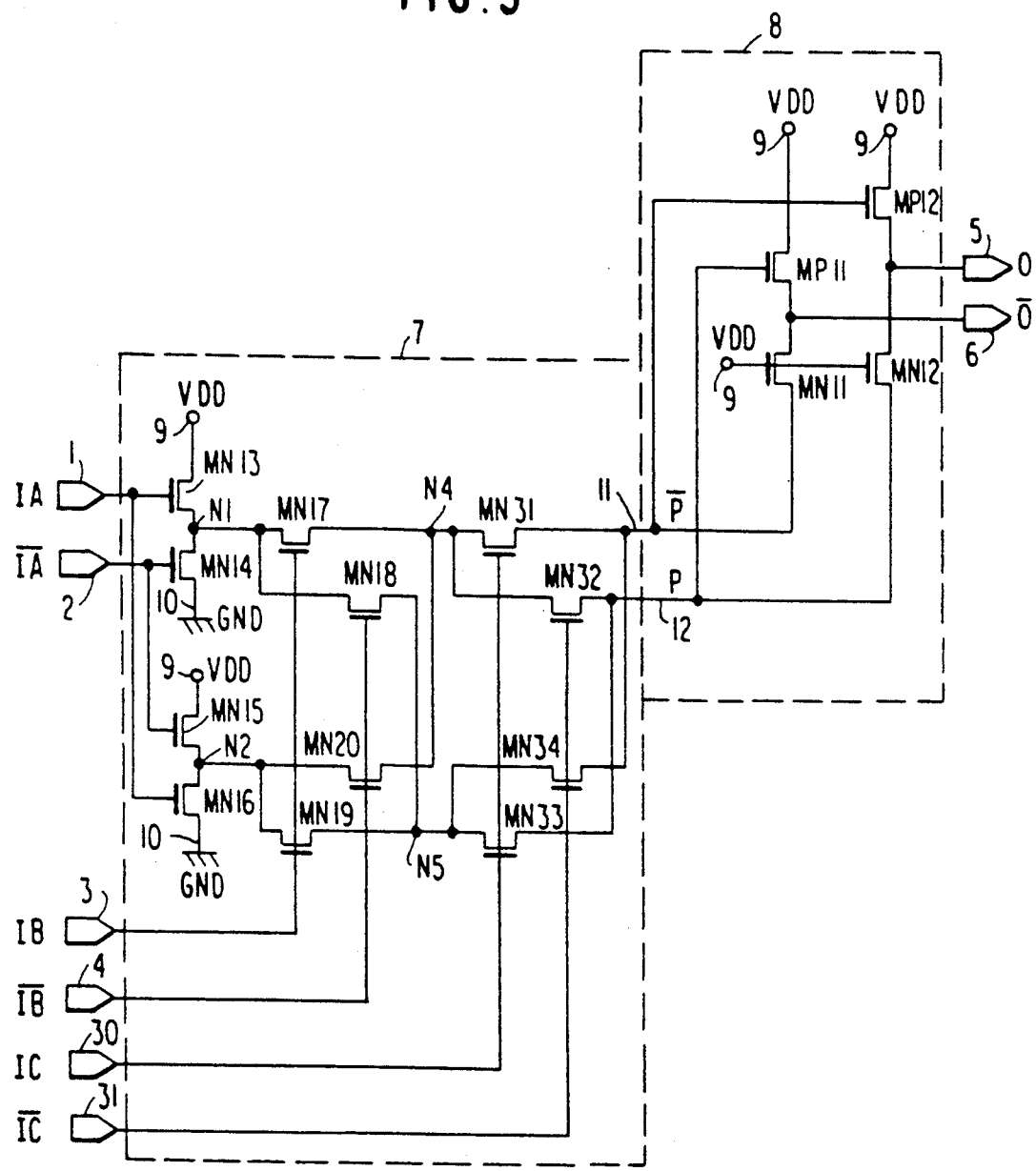
FIG. 3 is a circuit diagram representative of a third embodiment of the present invention.

Turning to FIG. 3, there is shown a 3-input EX-OR gate circuit as a third embodiment of the present invention, in which the same constituents as those shown in FIG. 1 are denoted by the same reference numerals and symbols to omit the further description thereof. In this gate circuit, the transistors MN17 and MN20 are connected in common at a node N4 and an enhancement N-channel MOS transistor MN31 is connected between this node N4 and the terminal 11. The transistors MN18 and MN19 are connected in common at a node N5 and an enhancement N-channel MOS transistor MN34 is connected between this node N5 and the terminal 11. Enhancement N-channel MOS transistors MN32 and MN33 are further provided and connected between the node N4 and the terminal 12 and between the node N5 and the terminal 12, respectively. A third input data signal IC, whose logic high level is the $V_{DD}$ level and whose logic low level is the GND level, is supplied to a third true input terminal 30 which is in turn connected in common to the gates of the transistors MN31 and MN33. An inverted data signal $\overline{IC}$ of the signal IC is supplied to a third complementary input terminal 31 which is in turn connected in common to the gates of the transistors MN32 and MN34. The remaining circuit construction is the same as that shown in FIG. 1. Accordingly, the gate circuit shown in FIG. 3 performs an exclusive OR logic operation on three input data signals IA, IB and IC at high speed with low power, and produces true and complementary output signals O and $\overline{O}$ each having a logic amplitude between the $V_{DD}$ level and substantially GND level.

Figure 4:
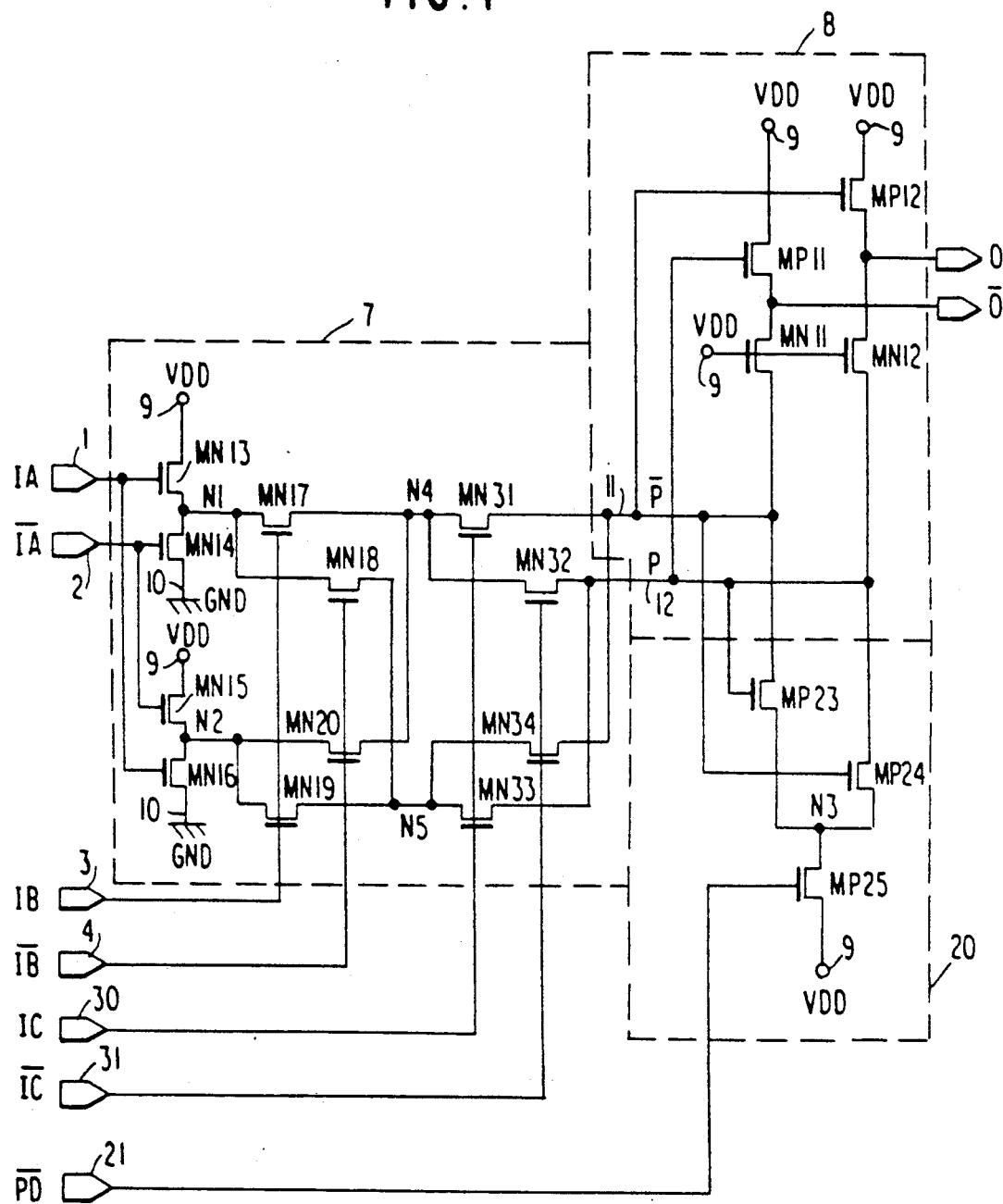
FIG. 4 is a circuit diagram representative of a fourth embodiment of the present invention.

The power reduction circuit 20 shown in FIG. 2 can be incorporated into the 3-input EX-OR gate circuit shown in FIG. 3. Such a gate circuit is shown in FIG. 4 as a fourth embodiment of the present invention.

Figure 5:
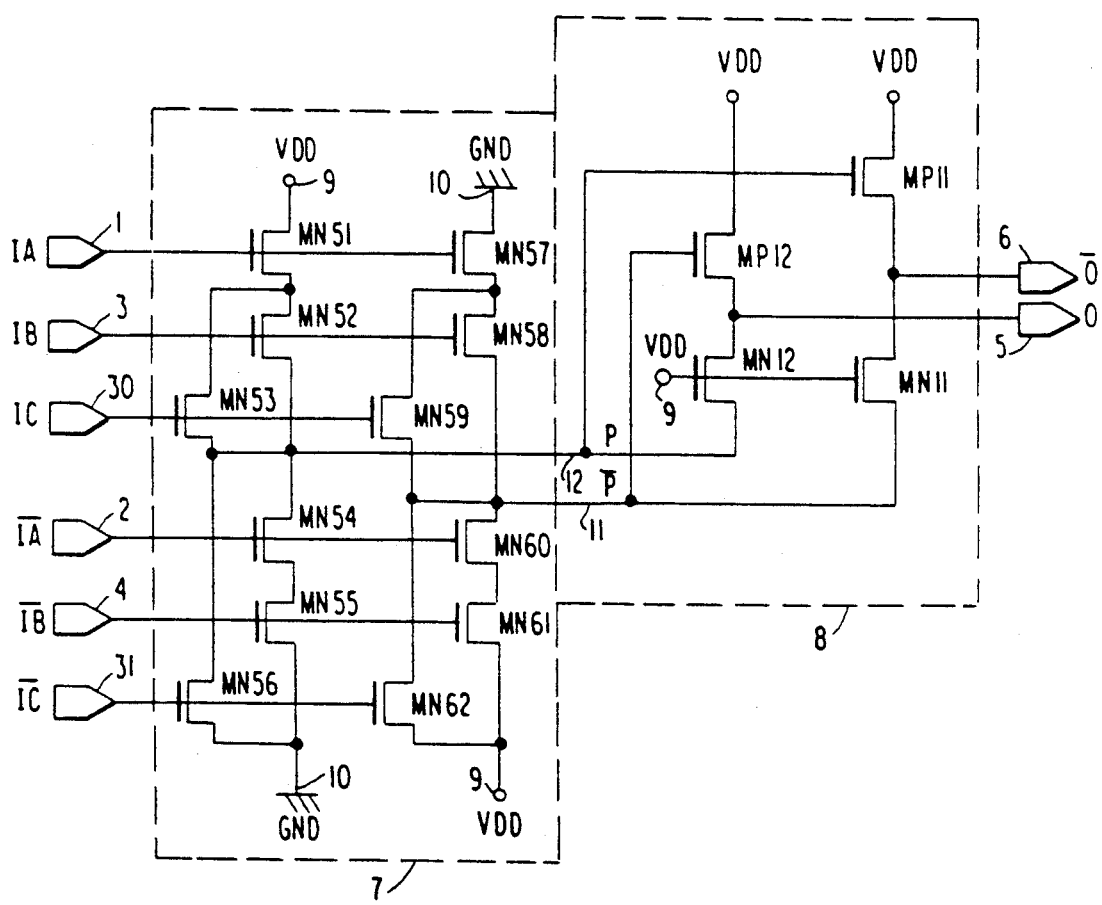
FIG. 5 is a circuit diagram representative of a fifth embodiment of the present invention.

Turning to FIG. 5, there is shown a gate circuit according to a fifth embodiment of the present invention, in which the same constituents as those shown in the previous drawings are indicated by the same reference numerals and symbols to omit further description thereof. The logic operation circuit 7 disclosed therein consists of twelve MOS transistors MN51 to MN62, all of which are of an enhancement N-channel type. These transistors MN51 to MN62 are connected and supplied selectively with data signals IA to $\overline{IC}$ as shown in the drawing. Therefore, the circuit 7 performs a logic operation of $IA \times (IB+IC)$ on three input data signals IA, IB and IC. The power reduction circuit 20 shown in FIG. 2 can be incorporated into the gate circuit shown in FIG. 5.

The present invention is not limited to the above embodiments, but may be chanted and modified without departing from the scope and spirit of the invention.

What is claimed is:

1. A transistor circuit comprising a first terminal supplied with a data signal having a logic high level lower than a first power voltage and a logic low level substantially equal to a second power voltage, a second terminal supplied with an inverted signal of said data signal, a third terminal from which an output signal is derived, a potential terminal supplied with said first power voltage, a first insulated gate transistor of a first channel type having a source-drain path connected between said potential terminal and said third terminal and a gate connected to said second terminal, and a second insulated gate transistor of a second channel type having a source-drain path connected between said first terminal and said third terminal and a gate connected to said potential terminal.

2. The transistor circuit as claimed in claim 1, wherein said first insulated gate transistor is of a P-channel type and said second insulated gate transistor is of an N-channel type.

3. The transistor circuit as claimed in claim 2, wherein the logic high level of said data signal is lower than said first power voltage by a threshold voltage of the N-channel type insulated gate transistor.

4. The transistor circuit as claimed in claim 1, further comprising a third insulated gate transistor of said first channel type and a fourth insulated gate transistor of said first channel type with their source-drain paths corrected in series between said potential terminal and said first terminal, means for connecting the gate of said third insulated gate transistor to said second terminal, and means coupled to the gate of said fourth insulated gate transistor for turning said fourth insulated gate transistor ON during a steady state in a logic level of said data signal.

5. A transistor circuit for receiving a data signal having a first logic amplitude and for producing an output signal having a second amplitude larger than said first logic amplitude, said circuit comprising a first terminal supplied with said data signal having a logic high level lower than a first power voltage and a logic low level substantially equal to a second power voltage, a second terminal supplied with an inverted signal of said data signal, a third terminal from which said output signal is derived, a fourth terminal from which an inverted signal of said output signal is derived, a power supply terminal, a first P-channel insulated gate transistor connected between said power supply terminal and said third terminal and having a gate connected to said second terminal, a first N-channel insulated gate transistor connected between said first and third terminals and having a gate connected to said power supply terminal, a second P-channel insulated gate transistor with a source-drain path connected between said power supply terminal and said fourth terminal and having a gate connected to said first terminal, and a second N-channel insulated gate transistor with a source-drain path connected between said second and fourth terminals and having a gate connected to said power supply terminal.

6. The transistor circuit as claimed in claim 5, wherein the logic high level of said data signal is lower than said first power voltage by a threshold voltage of said first and second N-channel type insulated gate transistors.

7. The transistor circuit as claimed in claim 5, further comprising a circuit node, a third P-channel insulated gate transistor connected between said first terminal and said circuit node and having the gate thereof connected to said second terminal, a fourth P-channel insulated gate transistor connected between said second terminal and between said circuit node and having the gate thereof connected to said first terminal, a fifth P-channel insulated gate transistor connected between said power supply terminal and said circuit node, and means coupled to the gate of said fifth P-channel insulated gate transistor for operatively bringing said fifth P-channel insulated gate transistor into a non-conductive state at least when said data signal changes in logic level.

8. An output circuit comprising a power terminal supplied with a power voltage, first and second input terminals, first and second output terminals, a first insulated gate transistor of one channel type having a source connected to said power terminal, a drain connected to said first output terminal and a gate connected to said second input terminal, a second insulated gate transistor of an opposite channel type having a source connected to said first input terminal, a drain connected to said first output terminal and a gate connected to said power terminal, a third insulated gate transistor of said one channel type having a source connected to said power terminal, a drain connected to said second output terminal and a gate connected to said first input terminal, a fourth insulated gate transistor of said opposite channel type having a source connected to said second input terminal, a drain connected to said second output terminal and a gate connected to said power terminal, means for supplying a data signal to said first input terminal, and means for supplying an inverted signal of said data signal to said second input terminal.

9. The output circuit as claimed in claim 8, wherein said first and third insulated gate transistors are of a P-channel type and said second and fourth insulated gate transistors are of an N-channel type.

10. In a high speed output level converter circuit adapted to enhance a distinction between the logic low and logic high levels of the output of a logic circuit providing a true-complementary binary signal pair in the form of a pair of said logic low and high levels as a result of logic operation on a plurality of binary signals, supplied thereto, said output level converter comprising:
a first P-channel insulated gate transistor and a first N-channel insulated gate transistor with their drains connected together;
a second P-channel insulated gate transistor and a second N-channel insulated gate transistor with their drains connected together;
means for supplying a first voltage to the sources of said first and second P-channel insulated gate transistors, and to the gates of said first and second N-channel insulated gate transistors;
means for supplying said true-complementary binary signal pair to the gates of said first and second P-channel insulated gate transistors respectively, and to the sources of said first and second N-channel insulated gate transistors respectively; and
means connected to a first junction of the drains of said first P-channel and N-channel insulated gate transistors and to a second junction of the drains of said second P-channel and N-channel insulated gate transistors for providing an output of said level converter circuit; whereby
the logic high level of the output of said logic circuit is raised to a voltage substantially equal to said first voltage, while the logic low level of the same output is kept unchanged at a second voltage defined by said logic circuit through said binary signal pair supplying means.

11. A high-speed output level converter circuit as claimed in claim 10, further comprising a power reduction circuit, said power reduction circuit comprising:
- a third P-channel insulated gate transistor and a fourth P-channel insulated gate transistor with their sources connected together;
- a fifth P-channel insulated gate transistor with its drain connected to a third junction of the sources of said third and fourth P-channel insulated gate transistors;
- means for connecting drains of said third and fourth P-channel insulated gate transistors to the sources of said first and second N-channel insulated gate transistors, respectively;
- means for supplying said first voltage to the source of said fifth P-channel insulated gate transistor;
- means for supplying said true-complementary binary signal pair to the gates of said third and fourth P-channel insulated gate transistors, respectively; and
- means coupled to the gate of said fifth P-channel insulated gate transistor for operatively rendering said fifth P-channel insulated gate transistor to a conductive state after the output of said level converter circuit is derived.

* * * * *

UNITED STATES PATENT AND TRADEMARK OFFICE
CERTIFICATE OF CORRECTION

PATENT NO. : 5,013,937

DATED : May 7, 1991

INVENTOR(S) : Yasushi Aoki

It is certified that error appears in the above-identified patent and that said Letters Patent is hereby corrected as shown below:

Col. 3, line 61, delete "gags", and insert --gates--;

Col. 6, line 66, delete "chanted" and insert --changed--.

Signed and Sealed this

Ninth Day of March, 1993

Attest:

STEPHEN G. KUNIN

*Attesting Officer*     *Acting Commissioner of Patents and Trademarks*